(12) United States Patent
Yukawa (10) Patent No.: US 7,545,840 B2
(45) Date of Patent: Jun. 9, 2009

(54) LASER ELEMENT AND METHOD FOR MANUFACTURING THE SAME

(75) Inventor: Mikio Yukawa, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 43 days.

(21) Appl. No.: 11/291,843

(22) Filed: Dec. 2, 2005

(65) Prior Publication Data

US 2006/0159144 A1 Jul. 20, 2006

(30) Foreign Application Priority Data

Dec. 6, 2004 (JP) ............... 2004-353414

(51) Int. Cl.
*H01S 3/14* (2006.01)

(52) U.S. Cl. ............... 372/39; 372/66; 372/68; 372/54

(58) Field of Classification Search ............ 372/53, 372/66, 39, 51–54; 257/40
See application file for complete search history.

(56) References Cited

U.S. PATENT DOCUMENTS

| | | | |
|---|---|---|---|
| 5,783,319 A * | 7/1998 | Reisfeld et al. ............ 428/690 |
| 6,351,482 B1 * | 2/2002 | Puzey ........................ 372/99 |
| 6,621,840 B2 | 9/2003 | Araki | |
| 6,687,266 B1 | 2/2004 | Ma et al. | |
| 6,879,618 B2 | 4/2005 | Cok et al. | |
| 2003/0062520 A1 * | 4/2003 | Toguchi et al. ............... 257/40 |
| 2004/0202893 A1 | 10/2004 | Abe | |
| 2004/0213308 A1 | 10/2004 | Abe et al. | |
| 2005/0056856 A1 | 3/2005 | Yamazaki et al. | |
| 2005/0058162 A1 * | 3/2005 | Nomura et al. ............... 372/9 |
| 2005/0069012 A1 * | 3/2005 | Shimomura et al. ......... 372/87 |
| 2005/0072977 A1 | 4/2005 | Saito et al. | |
| 2006/0133438 A1 | 6/2006 | Abe et al. | |
| 2006/0214151 A1 | 9/2006 | Abe et al. | |
| 2007/0114527 A1 | 5/2007 | Kumaki et al. | |

FOREIGN PATENT DOCUMENTS

JP 3206097 9/2001

OTHER PUBLICATIONS

Nir Tessler, "Lasers Based on Semiconducting Organic Materials," Adv. Mater. (Advanced Materials) 1999, vol. 11, No. 5, pp. 363-370.

* cited by examiner

*Primary Examiner*—Minsun Harvey
*Assistant Examiner*—Xinning (Tom) Niu
(74) *Attorney, Agent, or Firm*—Eric J. Robinson; Robinson Intellectual Property Law Office, P.C.

(57) ABSTRACT

It is an object of the present invention to provide a method that can provide regions having different thicknesses of a laminated body containing an organic compound with a light-emitting property in the same element and also can apply an electric field uniformly in all the regions of the element without depending on the thickness of the laminated body containing an organic compound with a light-emitting property. One laser element of the present invention has a laminated body containing an organic compound with a light-emitting property between two electrodes, and the laminated body includes a mixed layer of a metal oxide and an organic compound, which has a thickness distribution. The laser element emits light having different wavelengths in regions having different thicknesses of the mixed layer of a metal oxide and an organic compound, by applying voltage between two electrodes to feeding a current.

44 Claims, 5 Drawing Sheets

LASER ELEMENT AND METHOD FOR MANUFACTURING THE SAME

TECHNICAL FIELD

The present invention relates to a laser element and a manufacturing method thereof, and further in detail, relates to a laser element which is suitable for using in a field of data communication, security, micro fabrication, or the like.

BACKGROUND ART

A surface emission type laser element is a laser element which emits light in a perpendicular direction to a substrate surface, which is different from a conventional Fabry-Perot oscillator type laser element, is capable of arranging a large number of plane emission type laser elements on the same substrate; therefore, it is the element which has been noted in the field of data communication recently (for example, refer to Patent Document 1).

On the other hand, a research on a laser element using an organic compound which gives light emission with a large half width has been advanced. As for solid laser using light emission of an organic compound, light emission can be obtained by injecting holes and electrons to a thin film of at least one layer or more containing an organic compound (hereinafter, referred to as a laminated body containing an organic compound with a light-emitting property) which is placed between two electrodes, and laser light can be oscillated by amplifying the light emission efficiently.

In this case, a wavelength of oscillated laser light is limited to a wavelength which can be amplified by an oscillator, among wavelengths emitted from a compound having a role of light emission. An oscillator here has a structure in which light emission is kept in a surface having high reflectivity (hereinafter, referred to as a reflecting surface) and is amplified. Specifically, an edge of a laminated body containing an organic compound with a light-emitting property can be used as a reflecting surface or an electrode can be used as a reflecting surface. In the case of the former, light is reflected in a parallel direction to a substrate surface, and amplification is repeated; accordingly, laser oscillation is occurred. Consequently, laser light is oscillated in the parallel direction from the substrate surface. In the case of the latter, reflection and amplification of light are occurred in a perpendicular direction to the substrate surface, and laser light is oscillated in the perpendicular direction to the substrate surface. Adopting the latter method enables a large number of surface emission type laser elements to be arranged on the same substrate.

[Patent Document 1] Patent Publication No. 3206097

DISCLOSURE OF THE INVENTION

[Problems to be Solved by the Invention]

As described above, in a conventional current excitation laser element, a wavelength of oscillated laser light is limited to a wavelength which can be oscillated by an oscillator, among a light emission wavelength given by an organic layer. In other words, a wavelength which can be oscillated by one laser element is limited to one. Laser having a plurality of wavelengths cannot be oscillated from one laser element concurrently. Consequently, a plurality of individually independent laser elements was required to be placed on the same substrate. In this case, the smaller the size of the substrate becomes, the more precisely a position of each element is required to be controlled; thus, a problem that productivity is drastically decreased is occurred.

Also, as for a surface emission type laser element, a thickness of a placed laminated body containing an organic compound with a light-emitting property determines a length of a resonator. Then, laser light is oscillated with a single longitudinal mode which is determined depending on the length of the resonator. Therefore, an oscillation wavelength can be controlled by changing a thickness of an organic film. If this is used, changing a thickness of a laminated body containing an organic compound with a light-emitting property in the same element enables laser light having a plurality of wavelengths to be concurrently oscillated from one element. However, with this method, a plurality of regions having different current-voltage characteristics (hereinafter, referred to as an I-V characteristic) exists in the same element. Consequently, an electric field concentrates on a place in which current flows most easily, in other words, a region having a small thickness; thus, light is not emitted in the other portions, and only laser light of single wavelength is eventually oscillated. In addition, a short circuit is easily generated at a portion in which current concentrates.

In the present invention, it is an object to provide a method that can provide regions having different thicknesses of a laminated body containing an organic compound with a light-emitting property in the same element and also can apply an electric field uniformly in all the regions of the element without depending on the thickness of the laminated body containing an organic compound with a light-emitting property. In addition, it is an object to provide an element which can concurrently emit laser light with different plurality of wavelengths from within the same element by this method.

[Means for Solving the Problems]

As a result of repeated keen examinations, the inventors found that a mixed layer of a metal oxide and an organic compound has characteristics showing high conductivity and having a superior carrier injecting property to a layer containing an organic compound with a light-emitting property. It was found that a laser element in which the mixed layer was provided between electrodes as one layer constituting a laminated body containing an organic compound with a light-emitting property does not cause a rise in drive voltage, and that efficient light emission can be obtained. Further, it was found that the mixed layer of a metal oxide and an organic compound reflects high conductivity, and that it does not affect an I-V characteristic of an element even when a thickness of the mixed layer of a metal oxide and an organic compound is made large. The present invention provides an element having regions with different thicknesses in the same element by providing the mixed layer of a metal oxide and an organic compound, which is provided in the present invention, and controlling the thickness of the mixed layer. Furthermore, the present invention realizes a uniform I-V characteristic in the element even in the element having regions with different thicknesses in the same element. Accordingly, a laser element which oscillates laser light having different light emission wavelengths in the same element is provided.

One laser element of the present invention has a laminated body containing an organic compound with a light-emitting property between two electrodes, wherein the laminated body has a mixed layer of a metal oxide and an organic compound which has a thickness distribution.

Another laser element of the present invention has a laminated body containing an organic compound with a light-emitting property between two electrodes, wherein the laminated body has a mixed layer of a metal oxide and an organic compound which has a thickness distribution, and one of the electrodes has a concave and convex shape.

Another laser element of the present invention has a laminated body containing an organic compound with a light-emitting property between two electrodes, wherein the laminated body has a mixed layer of a metal oxide and an organic compound which has a thickness distribution, and one of the electrodes is provided over an insulating layer having a concave and convex shape.

One manufacturing method of a laser element of the present invention is forming a first electrode having a concave and convex shape; forming a mixed layer of a metal oxide and an organic compound over the first electrode; forming a layer containing an organic compound with a light-emitting property over the mixed layer; and forming a second electrode over the layer.

Another manufacturing method of a laser element of the present invention is forming a first electrode having a concave and convex shape; forming a first mixed layer of a first metal oxide and a first organic compound over the first electrode; forming a layer containing an organic compound with a light-emitting property over the first mixed layer; forming a second mixed layer of a second metal oxide and a second organic compound over the layer; and forming a second electrode over the second mixed layer.

Another manufacturing method of a laser element of the present invention is forming a first electrode; forming a layer containing an organic compound with a light-emitting property over the first electrode; forming a mixed layer of a metal oxide and an organic compound, which has a concave and convex shape, over the layer; and forming a second electrode over the mixed layer.

Another manufacturing method of a laser element of the present invention is forming a first electrode; forming a first mixed layer of a first metal oxide and a first organic compound; forming a layer containing an organic compound with a light-emitting property over the first mixed layer; forming a second mixed layer of a second metal oxide and a second organic compound, which has a concave and convex shape, over the layer; and forming a second electrode over the second mixed layer.

The above laser element oscillates light having different wavelengths in regions having different thicknesses of the mixed layer of a metal oxide and an organic compound, by applying voltage between the electrodes to feed a current.

The above laser element oscillates laser light having different wavelengths in regions having different thicknesses of the mixed layer of a metal oxide and an organic compound, by applying voltage between the electrodes to feed a current.

[Effect of the Invention]

In the present invention, a mixed layer of an organic compound and a metal oxide, which is placed between electrodes as one layer of a laminated body containing an organic compound with a light-emitting property, has high conductivity; therefore, a change in an I-V characteristic of an element is not occurred even when a thickness of the mixed layer is changed. Consequently, a distance between electrodes, in other words, a resonator length, can be made large without causing a change in an I-V characteristic by thinning a thickness of the mixed layer. In the same manner, by thinning a thickness of the mixed layer, a distance between electrodes, in other words, a resonator length, can be made small without causing a change in an I-V characteristic.

Consequently, placing regions having different thicknesses in a mixed layer inside an element enables laser light having different wavelengths to be emitted concurrently from a single element in a perpendicular direction to a substrate surface.

Also, by changing a thickness of a mixed layer of a metal oxide and an organic compound and dimensions of regions having different thicknesses, a spectrum shape obtained from one element can be controlled. That is, in an emission spectrum obtained from one element, it becomes possible to control a light emission wavelength and its intensity randomly. By using this, it becomes possible to create a spectrum shape which is peculiar to each element and to give large volume of information to laser light itself which is emitted.

Also, a spectrum shape obtained from one element can be controlled; therefore, laser light having random light emission can be given. In other words, the conventional laser light has a characteristic of giving a single spectrum with an extremely narrow half width; however, laser light obtained by the present invention has a narrow half width, and gives a plurality of emission spectrums. Consequently, by controlling intensity and a wavelength of an emission spectrum, it is also possible to give laser light of random colors, which range blue to red.

BEST MODE FOR CARRYING OUT THE INVENTION

Embodiment modes of the present invention are described with reference to drawings. However, the present invention is not limited to descriptions below, and it is easily understood by those skilled in the art that modes and details can be modified in various ways without departing from the purpose and the scope of the present invention. Therefore, the present invention is not limited to the description of embodiment modes to be given below. Note that the same portions or the portions having similar functions in structures of the present invention described below are denoted by the same reference numerals in different drawings and detailed descriptions thereof are omitted.

Embodiment Mode 1

Hereinafter, an embodiment mode of the present invention will be described specifically and in detail with an example of the embodiment mode, with reference to FIG. 1.

Figure 1A:
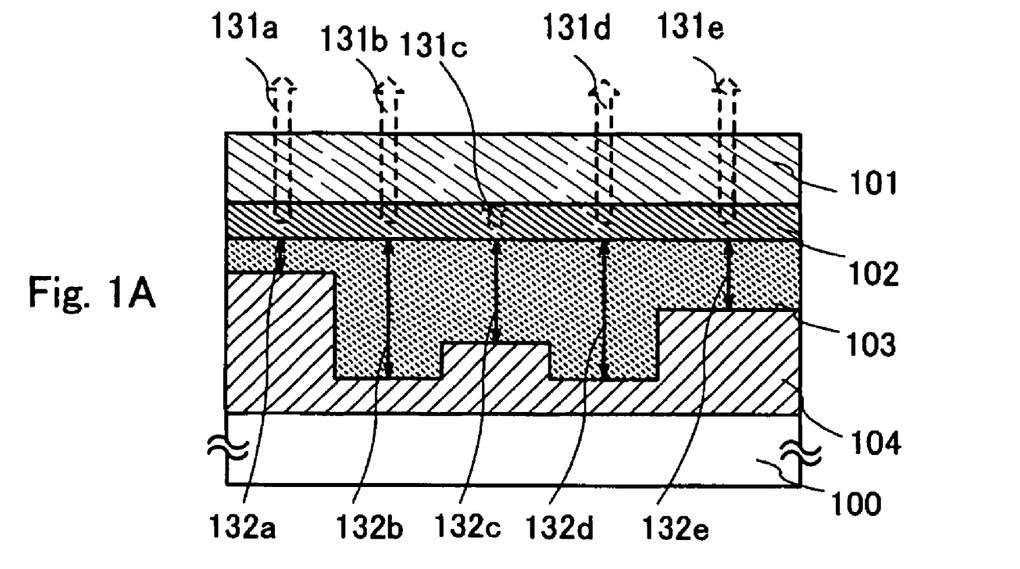

First, a first electrode 104 is formed on a substrate 100. A known material can be used as an electrode. For example, as a material having a large work function (specifically, 4.0 eV or more), it is preferable to use an alloy, a conductive compound, and a mixture thereof. Specifically, indium tin oxide (Indium Tin Oxide, hereinafter referred to as ITO) or indium tin oxide containing silicon, indium oxide containing zinc oxide (ZnO) of 2 to 20 wt %, and the like are given. These conductive metal oxide films are generally formed by sputtering; however, the films may be manufactured by applying a sol-gel method. In addition, it is also possible to use gold (Au), platinum (Pt), nickel (Ni), tungsten (W), chromium (Cr), molybdenum (Mo), iron (Fe), cobalt (Co), copper (Cu), palladium (Pd), or nitride of a metal material (for example, titanium nitride: TiN), or the like.

On the contrary, it is also possible to use a metal having a small work function (specifically, 3.8 eV or less), an alloy, a conductive compound, or a mixture thereof, and the like. Specifically, a metal belonging to Group 1 or Group 2 of the periodic table, that is, an alkali metal such as lithium (Li) or cesium (Cs); an alkaline earth metal such as magnesium (Mg), calcium (Ca) or strontium (Sr); or an alloy containing these (MgAg, AlLi); a rare earth metal such as europium (Eu) or ytterbium (Yb); and an alloy containing these are given.

Further, as for an electrode which injects holes to a laminated body containing an organic compound with a light-emitting property, in a case of being used, among two electrodes, as an electrode in which light emission can be obtained by applying higher voltage, it is preferable to use an electrode with a large work function. In addition, as for an electrode which injects electrons, in a case of being used, among two electrodes, as an electrode in which light emission can be obtained by applying lower voltage, it is preferable to use an electrode having a small work function.

Next, a micro fabrication is performed to the first electrode to partially change a thickness of the electrode. As a micro fabricating method, in addition to a mechanical micro fabrication, a crystallization after a deposition of the first electrode, an etching by laser light or an electron beam or the like, a treatment in which stress is applied to a substrate after the deposition of the first electrode to make a substrate which is not flat, dissolution of part of the first electrode by a chemical, or a treatment to cause a reaction, or the like can be given. Also, an electrode material or a film formation method, which has not been adopted in the past because of being unable to form a flat film, can be used. With the above steps, the first electrode 104 having a concave and convex shape is formed.

Subsequently, a mixed layer 103 of an organic compound and a metal oxide is formed over the first electrode 104 to which a micro fabrication is performed. If the first electrode 104 is an electrode where light emission can be obtained by applying higher voltage, a transition metal oxide or the like showing an electron accepting property (hole transporting property) to an organic compound can be given as a preferable example of a metal oxide. For example, titanium oxide (TiOx), zirconium oxide (ZrOx), hafnium oxide (HfOx), vanadium oxide (VOx), niobium oxide (NbOx), tantalum oxide (TaOx), chromium oxide (CrOx), molybdenum oxide (MoOx), tungsten oxide (WOx), rhenium oxide (ReOx), ruthenium oxide, or the like is given. On the other hand, as an organic compound, an aromatic amine compound showing an electron donating property to the above metal oxide is preferable. For example, 4,4',4"-tris(N,N-diphenyl-amino)triphenylamine (abbreviation: TDATA); 4,4', 4"-tris[N-(3-methylphenyl)-N-phenylamino]triphenylamine (abbreviation: MTDATA); 1,3,5-tris[N,N-bis(3-methylphenyl)amino]benzene (abbreviation: m-MTDAB); N,N'-diphenyl-N,N'-bis(3-methylphenyl)-1,1'-biphenyl-4,4"diamine (abbreviation: TPD); 4,4'-bis[N-(1-naphthyl)-N-phenylamino]biphenyl (abbreviation: NPB); 4,4'-bis(N-{4-[N,N-bis(3-methylphenyl)amino]phenyl}-N-phenylamino)biphenyl (abbreviation: DNTPD); 4,4',4"-tris(N-carbazolyl)triphenylamine (abbreviation: TCTA), and the like are given. With such a structure, electrons are given and received between an organic compound and a metal oxide, carriers are generated, and a carrier injecting property to a layer 102 containing an organic compound with conductivity and a light-emitting property is improved.

If the electrode 104 is an electrode where light emission can be obtained by applying lower voltage than a second electrode 101, it is possible to use various metal oxides, metal nitrides, or metal oxynitrides. Furthermore, it is also preferable to use a material showing an electron donating property such as alkali metal oxide, alkaline earth metal oxide, rare earth metal oxide, alkali metal nitride, alkaline earth metal nitride, or rare earth metal nitride. Specifically, lithium oxide, strontium oxide, barium oxide, erbium oxide, lithium nitride, magnesium nitride, calcium nitride, yttrium nitride, lanthanum nitride, and the like are given. On the other hand, electron carriers are generated in an organic compound; therefore, it is preferable to use an organic compound with an electron transporting property. As an organic compound with an electron transporting property, tris(8-quinolinolato)aluminum (abbreviation: Alq$_3$); tris(4-methyl-8-quinolinolato)aluminum (abbreviation: Almq$_3$); bis(10-hydroxybenzo[h]-quinolinato)beryllium (abbreviation: BeBq$_2$); bis(2-methyl-8-quinolinolato)(4-phenylphenolato)aluminum (abbreviation: BAlq); bis [2-(2'-hydroxyphenyl)benzoxazolato]zinc (abbreviation: Zn(BOX)$_2$); bis[2-(2'-hydroxyphenyl)benzothiazolato]zinc (abbreviation: Zn(BTZ)$_2$); bathophenanthroline (abbreviation: BPhen); bathocuproin (abbreviation: BCP); 2-(4-biphenylyl)-5-(4-tert-butylphenyl)-1,3,4-oxadiazole (abbreviation: PBD); 1,3-bis[5-(4-tert-butylphenyl)-1,3,4-oxadiazole-2-yl]benzene (abbreviation: OXD-7); 2,2'2"-(1,3,5-benzenetriyl)-tris(1-phenyl-1H-benzimidazole) (abbreviation: TPBI); 3-(4-biphenyl)-4-phenyl-5-(4-tert-butylphenyl)-1,2,4-triazole (abbreviation: TAZ); 3-(4-biphenylyl)-4-(4-ethylphenyl)-5-(4-tert-butylphenyl)-1,2,4-triazole (abbreviation: p-EtTAZ), and the like are given; however, an organic compound is not limited thereto. In addition, among the compounds described above, a chelate metal complex having a chelate ligand containing an aromatic ring typified by Alq$_3$, Almq$_3$, BeBq$_2$, BAlq, Zn(BOX)$_2$, Zn(BTZ)$_2$ or the like; an organic compound having a phenanthroline skeleton typified by BPhen, BCP or the like; and an organic compound having an oxadiazole skeleton typified by PBD, OXD-7 or the like easily generate carriers, and are a preferable compound group as an organic compound.

The above mixed layer 103 of an organic compound and a metal oxide can use an evaporation method, an application method such as a spin coating method, and a sol-gel method. Also, a droplet discharging (ejecting) method (also referred to as an ink-jetting method depending on its mode) capable of forming into a predetermined pattern by selectively discharging (ejecting) a droplet of a composition mixed for a particular purpose; a method capable of transferring or drawing an object into a desired pattern, for example, various printing methods (a method for forming into a desired pattern, such as screen (mimeograph) printing, offset (lithography) printing, relief printing, gravure (intaglio) printing) can be used.

Further, in a case of forming the mixed layer 103 of an organic compound and a metal oxide by evaporation, there is a possibility that concavity and convexity is generated on a surface of the mixed layer. In this case, the surface may be polished to be flat. Also, in order to increase flatness, the surface may be pressed with pressure to be flat. As a method for pressing, a roller-like object may be scanned on the surface so as to even and reduce the concavity and convexity, or the surface may be perpendicularly pressed with a flat plate-like object. A heating process may be performed at the time of pressing. Also, the surface may be softened or dissolved by a solvent or the like, and the concavity and convexity of the surface may be removed by an air knife. In addition, polishing may be performed by using a CMP method.

Subsequently, the layer 102 containing an organic compound with a light-emitting property is formed on the mixed layer 103 of an organic compound and a metal oxide. The layer 102 containing an organic compound with a light-emitting property may be one layer, or a layer containing an organic compound with a light-emitting property having a different composition may be stacked. In the layer 102 containing an organic compound with a light-emitting property, holes and electrons injected from electrodes are recombined, and light emission is obtained. Therefore, a material which is used for the layer 102 containing an organic compound with a light-emitting property and its thickness, the number of stacked layer of the layer 102 containing an organic compound with a light-emitting property, and the like are determined in consideration of light emission efficiency, a spectrum of a material which has a role of light emission, or the like.

Hereinafter, specific examples of a material which is used for the layer 102 containing an organic compound with a light-emitting property are given. First, a material giving light emission to a visible light region is essential in the present element. As such a material, a fluorescent material is preferable. Specifically, a typical metal complex such as tris(8-quinolinolato)aluminum (abbreviation: $Alq_3$); tris(4-methyl-8-quinolinolato)aluminum (abbreviation: $Almq_3$); bis(10-hydroxybenzo[h]-quinolinato)beryllium (abbreviation: $BeBq_2$); bis(2-methyl-8-quinolinolato)-(4-hydroxy-biphenylyl)-aluminum (abbreviation: BAlq); bis[2-(2-hydroxyphenyl)-benzoxazolato]zinc (abbreviation: $Zn(BOX)_2$); or bis[2-(2-hydroxyphenyl)-benzothiazolato]zinc (abbreviation: $Zn(BTZ)_2$) is given. Alternatively, a hydrocarbon based compound such as 9,10-diphenylanthracene or 4,4'-bis(2,2-diphenylethenyl)biphenyl is also preferable.

Alternatively, a mixed layer of the above material and another light-emitting material may be formed. In other words, a light-emitting efficiency can be increased by mixing a small amount of fluorescent pigment or phosphorescent pigment to the above luminous body. As a fluorescent material, a coumarin derivative; a quinacridone derivative; an acridine derivative; a pyrene derivative; a perylene derivative; an anthracene derivative; a pyron derivative, and the like are given. As a phosphorescent pigment, as a triplet light-emitting material, a transition metal complex such as Ir, Ru, Rh, Pt, or a rare earth metal such as tris(2-phenylpyridine)iridium (hereinafter, referred to as "$Ir(ppy)_3$"); 2,3,7,8,12,13,17,18-octaethyl-21H, or 23H-porphyrin-platinum (hereinafter referred to as "PtOEP") is given.

Further, as the layer 102 containing an organic compound with a light-emitting property, in addition to the above-described layer which has a role of light emission (hereinafter, referred to as a light-emitting layer), a layer which promotes a transportation of holes and electrons injected from electrodes (hereinafter, referred to as carriers when both holes and electrons are indicated) may be provided. Specifically, as a layer promoting a transportation of holes (hereinafter, a hole transporting layer), there is an aromatic amine based (that is, benzene ring-nitrogen bond) compound. As a material which is widely used, 4,4'-bis[N-(3-methylphenyl)-N-phenyl-amino]-biphenyl; a starburst aromatic amine compound such as 4,4'-bis[N-(1-naphthyl)-N-phenyl-amino]-biphenyl; 4,4',4"-tris(N,N-diphenyl-amino)-triphenylamine and 4,4',4"-tris[N-(3-methylphenyl)-N-phenyl-amino]-triphenylamine, which are a derivatives thereof are given. On the other hand, as a preferable material for a layer promoting a transportation of electrons (hereinafter, an electron transporting layer), the above-described typical metal compounds are given; however, a triazole derivative such as 3-(4-tert-butylphenyl)-4-(4-ethylphenyl)-5-(4-biphenylyl)-1,2,4-triazole, or a phenanthroline derivative such as bathophenanthroline or bathocuproine may also be used alternatively.

In a case of providing these electron transporting layer and hole transporting layer, the electron transporting layer is provided between the light-emitting layer and a cathode, and the hole transporting layer is provided between the light-emitting layer and an anode.

Thereafter, a second electrode 101 may be formed. Further, in a case of using the second electrode 101 as a cathode, a material promoting an injection of electrons (hereinafter, referred to as an electron injecting material) to the layer 102 containing an organic compound with a light-emitting property may also be provided between the layer 102 containing an organic compound with a light-emitting property and the second electrode 101. As an electron injecting material, an alkali metal salt and an alkaline metal or the like such as calcium fluoride, lithium fluoride, lithium oxide, or lithium chloride may be applied. In a case of providing such electron injecting materials, a work function of the cathode may be large, for example, metal or a conductive inorganic compound such as Al, Ag, or ITO can also be used. Note that an evaporation method, a sputtering method, or a wet method using a sol-gel method can be applied to these electrodes.

Light emitted from the layer 102 containing an organic compound with a light-emitting property is repeatedly reflected to be amplified between the above described first electrode 104 and the second electrode 101, and it is finally taken out as laser light from one of the electrode sides. Therefore, one of the electrodes functions as a reflecting mirror, and the other electrode functions as an exit mirror. The electrode functioning as a reflecting mirror preferably has high reflectivity. Specifically, 50% or more, preferably 95% or more. On the other hand, reflectivity of an exit mirror is preferably set to be 50% to 95%. Such a control of reflectivity can be controlled by selecting a material and a thickness. With the above steps, a laser element in this embodiment mode is completed.

In this embodiment mode, light emitted from the layer 102 having an organic compound with a light-emitting property is emitted from the second electrode 101 side, as laser light 131a, laser light 131b, laser light 131d, and laser light 131e. The mixed layer 103 of an organic compound and a metal oxide has difference in its thickness depending on regions, as thickness 132a, a thickness 132b, a thickness 132c, a thickness 132d, and a thickness 132e, and has a thickness distribution. A wavelength of the emitted laser light is greatly affected by the thickness. Therefore, each laser light 131a, laser light 131b, laser light 131d, and laser light 131e has a different wavelength, and there is a case where laser light is attenuated without being emitted to the outside of a laser element as laser light, like the laser light 131c.

Figure 1B:
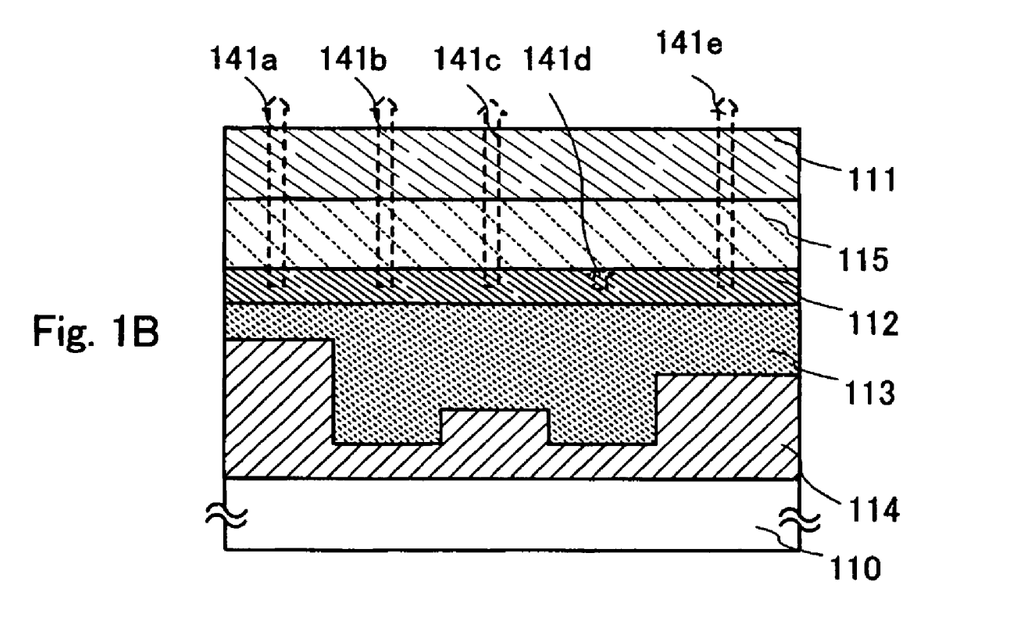

A laser element of FIG. 1(B) is an example in which a second mixed layer of an organic compound and a metal oxide is provided between the second electrode 101 and the layer 102 containing an organic compound with a light-emitting property in the laser element of FIG. 1(A). In FIG. 1(B), a first electrode 114 having a concave and convex shape, a first mixed layer 113 of an organic compound and a metal oxide provided so as to planarize the concavity and convexity, a layer 112 containing an organic compound with a light-emitting property, a second mixed layer 115 of an organic compound and a metal oxide, and a second electrode 111 are stacked over a substrate 110.

As shown in FIG. 1(B), a structure, in which the first mixed layer 113 of an organic compound and a metal oxide is provided between the layer 112 having an organic compound with a light-emitting property and the first electrode 114, and the second mixed layer 115 of an organic compound and a metal oxide is provided between the layer 112 having an organic compound with a light-emitting property and the second electrode 111, is adopted, and a mixed layer of two kinds of an organic compound and a metal oxide may be provided. In this case, a selection of an organic compound and a metal oxide may be selected from the above-described materials, in accordance with the first electrode 114, the second electrode 111, and the level of applied voltage.

According to the first mixed layer 113 of an organic compound and a metal oxide having a thickness distribution, there is also a case where each laser light 141a, laser light 141b, laser light 141c, and laser light 141e is passed through the second electrode 111 to be emitted with different wavelengths in the same manner as the laser element of FIG. 1(A) and laser light is attenuated inside the laser element without being emitted as laser light, like light 141d.

By providing regions having different thicknesses as described above, it becomes possible that laser light having different wavelengths are emitted concurrently from a single element in a perpendicular direction to a substrate surface. Also, by changing a thickness of the mixed layer of an organic compound and a metal oxide and dimensions of regions having different thicknesses, a spectrum shape which is obtained from one element can be controlled. In other words, in an emission spectrum which is obtained from one element, it becomes possible to arbitrarily control a wavelength and its strength. By using this, it becomes possible to create a spectrum shape which is peculiar to each element and to give large volume of information to laser light itself which is emitted.

Note that the present invention is not limited to laser oscillation using light emission from an organic compound but can also be applied to semiconductor laser using light emission from an inorganic material. In this case, an inorganic semiconductor layer may be formed instead of a layer containing an organic compound with a light-emitting property. As an inorganic semiconductor layer, GaAs, InP, and the like are given; however, the inorganic semiconductor layer is not limited thereto.

The spectrum shape which is obtained from one element can be controlled; therefore, laser light having random light emission can be given. In other words, conventional laser light has a characteristic of giving a single spectrum with an extremely narrow half width. However, while having a narrow half width, laser light which can be obtained by the present invention gives a plurality of emission spectrums. Therefore, by controlling the strength and wavelength of the emission spectrum, it is also possible to give laser light of random colors, which range blue to red.

Embodiment Mode 2

This embodiment mode will be an example in which a shape of a stacked layer including an electrode constituting a laser element is different in Embodiment Mode 1. Therefore, repeated descriptions of the same portions or the portions having similar functions are omitted.

In Embodiment Mode 1, the example in which concavity and convexity is formed in the first electrode 104 and the mixed layer of an organic compound and a metal oxide is stacked thereover, was shown. In this embodiment mode, an example in which concavity and convexity is formed in a mixed layer of an organic compound and a metal oxide, and a second electrode is formed thereover, is shown. In other words, a first electrode and a layer containing an organic compound with a light-emitting property are sequentially formed over a substrate, and then, after a mixed layer of an organic material and a metal oxide is formed, micro fabrication is performed thereto to form a concave and convex structure of a random shape. Thereafter, the second electrode is formed.

Figure 2A:
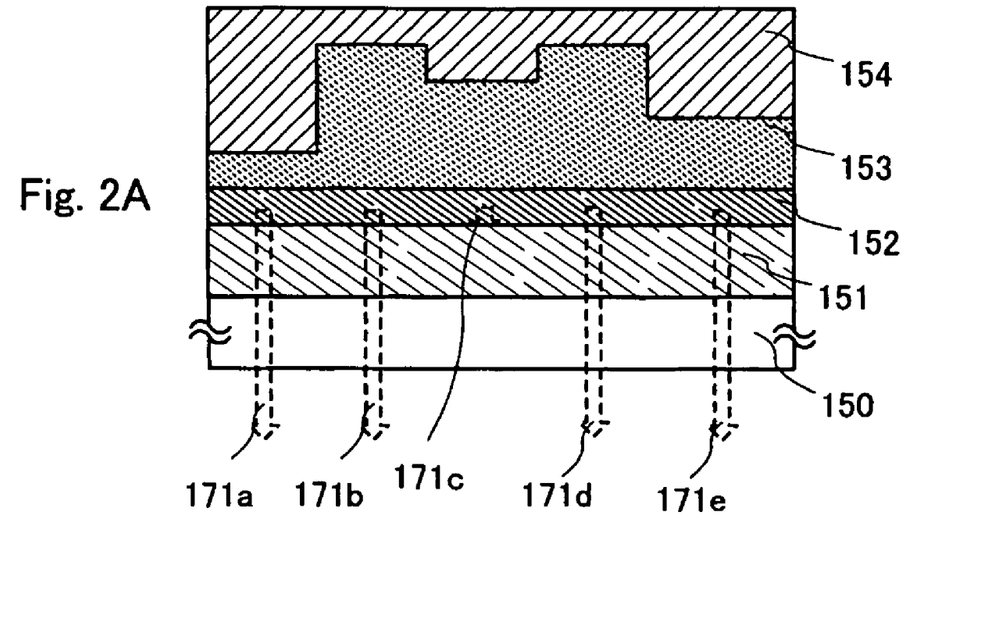

This embodiment mode will be described with reference to FIG. 2. A laser element shown in FIG. 2(A) is provided over a substrate 150, and the substrate 150 has a transmitting property with respect to emitted laser light. A first electrode 151 is formed on the substrate 150, and a layer 152 having an organic compound with a light-emitting property is formed on the first electrode 151. A mixed layer 153 of an organic compound and a metal oxide formed of selected materials is formed to be in contact with the layer 152 having an organic compound with a light-emitting property, depending on the level of voltage applied to the first electrode 151 and a second electrode 154.

The mixed layer 153 of an organic compound and a metal oxide can be formed by performing micro fabrication to a mixed layer of an organic compound and a metal oxide, and by partially changing a thickness of the mixed layer of an organic compound and a metal oxide. As a method of micro fabrication, mechanical micro fabrication, etching by laser light, an electron beam or the like, dissolving part of the mixed layer 153 of an organic compound and a metal oxide by a chemical, or causing a reaction, or the like is given. For example, after the mixed layer of an organic compound and a metal oxide is formed, its shape may be selectively processed by using a mask or the like. Also, a layer structure in which a thickness is unequal can also be applied by making the mixed layer of an organic compound and a metal oxide to be a stacked layer structure and forming layers selectively.

In this embodiment mode, light emitted from the layer 152 having an organic compound with a light-emitting property is emitted from the first electrode 151 side, as laser light 171a, laser light 171b, laser light 171d, and laser light 171e. The mixed layer 153 of an organic compound and a metal oxide has a difference in a thickness depending on regions; therefore, a laminated body containing an organic compound with a light-emitting property which exits between electrodes has a thickness distribution. A wavelength of the emitted laser light is greatly affected by the thickness. Therefore, each laser light 171a, laser light 171b, laser light 171d, and laser light 171e are repeatedly reflected to be amplified and has a different wavelength eventually, and there is a case where laser light is attenuated without being emitted to the outside of a laser element as laser light, like the laser light 171c.

Figure 2B:
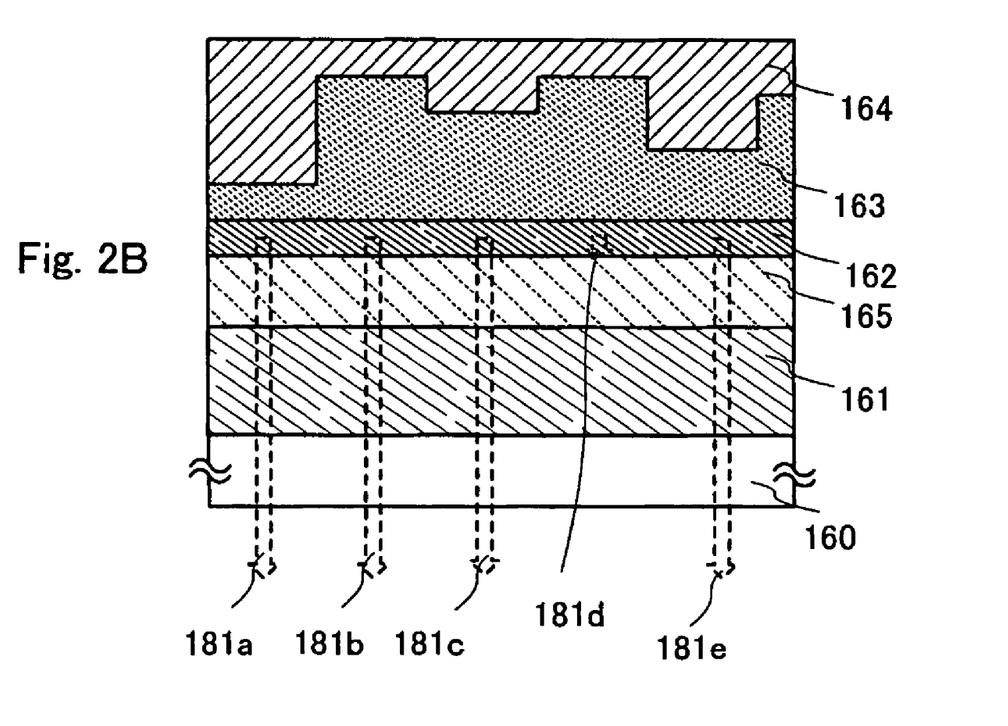

A laser element of FIG. 2(B) is an example in which a second mixed layer of an organic compound and a metal oxide is provided between the first electrode 151 and the layer 152 containing an organic compound with a light-emitting property in FIG. 2(A). In FIG. 2(B), a first electrode 161, a second mixed layer 165 of an organic compound and a metal oxide, a layer 162 having an organic compound with a light-emitting property, a first mixed layer 163 of an organic compound and a metal oxide formed so as to have a concave and convex shape, and a second electrode 164 are stacked over a substrate 160. In this embodiment mode, the second electrode 164 is formed so as to planarize a concave and convex surface included in the first mixed layer 163 of an organic compound and a metal compound; however, a wavelength of emitted laser light depends on a thickness of a laminated body containing an organic compound with a light-emitting property which exists between the electrodes; therefore, the second electrode 164 may be formed by reflecting the concave and convex shape included in the first mixed layer 163 of an organic compound and a metal compound.

The first mixed layer 613 of an organic compound and a metal oxide has a thickness distribution; therefore, in the same manner as FIG. 2(A), laser light 181a, laser light 181b, laser light 181c, and laser light 181e are repeatedly reflected to be amplified, and passed through the first electrode 161 to be eventually emitted with different wavelengths, and light 181d cannot be emitted as laser light and is attenuated inside the laser element. In this embodiment mode, a structure, in which the laser light 171a, the laser light 171b, the laser light 171d, and the laser light 171e are taken out from the first electrode 151, and laser light 181a, laser light 181b, laser light 181c, and laser light 181e are taken out from the first electrode 161, is applied; however, a structure of taking out from the second electrode 154 and the second electrode 164 may also be applied. One of the electrodes functions as a reflecting mirror, and the other electrode functions as an exit mirror. Such a control of reflectivity can be controlled by selecting a material and a thickness. In this embodiment mode, the second electrode 154 and the second electrode 164 in which each has a difference in a thickness between the electrodes are used as reflecting mirrors, and the first electrode 151 and the first electrode 161 in which each has a uniform thickness are used as exit mirrors. With the above steps, the laser element in this embodiment mode is completed.

By providing regions having different thicknesses as described above, it becomes possible that laser light having different wavelengths are emitted concurrently from a single element in a perpendicular direction to a substrate surface. Also, by changing a thickness of a mixed layer of a metal oxide a metal oxide and an organic compound and the regions having different thicknesses, a spectrum shape which is obtained from one element can be controlled. In other words, in an emission spectrum which is obtained from one element, it is possible to arbitrarily control a light emission wavelength and its intensity. By using this, it is possible to create a spectrum shape which is peculiar to each element and to give large volume of information to laser light itself which is emitted.

The spectrum shape which is obtained from one element can be controlled; therefore, laser light having random light emission can be given. In other words, conventional laser light has a characteristic of giving a single spectrum with an extremely narrow half width. However, while having a narrow half width, laser light which can be obtained by the present invention gives a plurality of emission spectrums. Therefore, by controlling the strength and wavelength of the emission spectrum, it is also possible to give laser light of random colors, which range blue to red.

Embodiment Mode 3

This embodiment mode will be an example in which a shape of a stacked layer including an electrode constituting a laser element is different in Embodiment Mode 1. Therefore, repeated descriptions of the same portions or the portions having similar functions are omitted.

In Embodiment Mode 1 and Embodiment Mode 2, the electrodes or the mixed layer of a metal oxide and an organic compound constituting the laser element is formed so as to have a concave and convex shape. However, in this embodiment mode, an example, in which a layer having a concave and convex shape is separately formed and a thickness of a laminated body containing an organic compound with a light-emitting property which exists between electrodes is controlled by using the concave and convex shape of the layer, is shown. In other words, a laser element is formed in a flat region in Embodiment Mode 1 and Embodiment Mode 2; however, a laser element is formed in a region having a concave and convex shape in this embodiment mode.

Figure 4A:
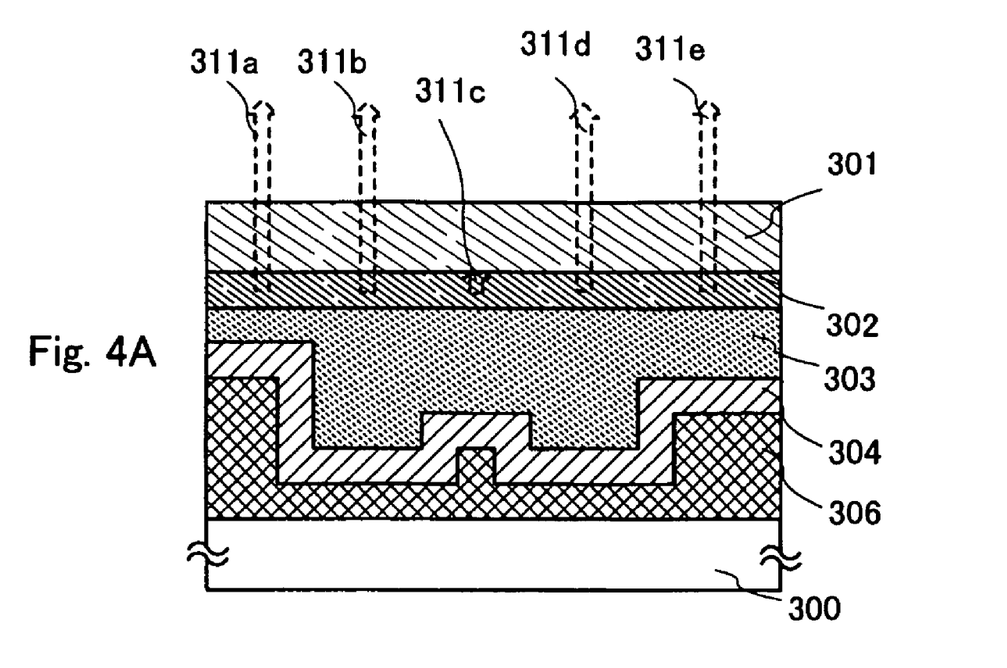

A laser element of this embodiment mode is shown in FIG. 4. A laser element shown in FIG. 4(A) is provided on a layer 306 having a concave and convex shape which was formed on a substrate 300. The layer 306 having a concave and convex shape can use an organic material, an inorganic material, or a compound or a mixed material thereof. A formation may be selectively performed so as to have a concave and convex shape, or after forming the layer, a process may be performed so as to have a concave and convex shape by a mechanical or chemical treatment. In this manner, by applying a structure in which the layer 306 having a concave and convex shape is separately provided, in order to make a difference in a thickness to the laminated body containing an organic compound with a light-emitting property, a range of choosing a material or a formation method is expanded; therefore, the thickness of the laminated body containing an organic compound with a light-emitting property can be controlled more precisely. Accordingly, a wavelength of obtained laser light can also be controlled more precisely.

A first electrode 304 formed on the layer having a concave and convex shape reflects the concave and convex shape to become the first electrode 304 having a concave and convex shape. A mixed layer 303 of a metal oxide and an organic compound is formed so as to planarize a concave and convex surface included in the first electrode 304. A layer 302 containing an organic compound with a light-emitting property and a second electrode 301 are stacked over the mixed layer of a metal oxide and an organic compound, and thereafter, a laser element of this embodiment mode is manufactured.

In this embodiment mode, light emitted from the layer 302 containing an organic compound with a light-emitting property is repeatedly amplified to be emitted from the second electrode 301 side as laser light 311a, laser light 311b, laser light 311d, and laser light 311e eventually. The mixed layer 303 of an organic compound and a metal oxide has a difference in its thickness depending on regions; therefore, a laminated body containing an organic compound with a light-emitting property which exists between electrodes has a thickness distribution. A wavelength of emitted light is highly affected by its thickness. Accordingly, each laser light 311a, laser light 311b, laser light 311d, and laser light 311e has a different wavelength, and there is a case where laser light is attenuated without being emitted to the outside of a laser element as laser light, like light 311c.

Figure 4B:
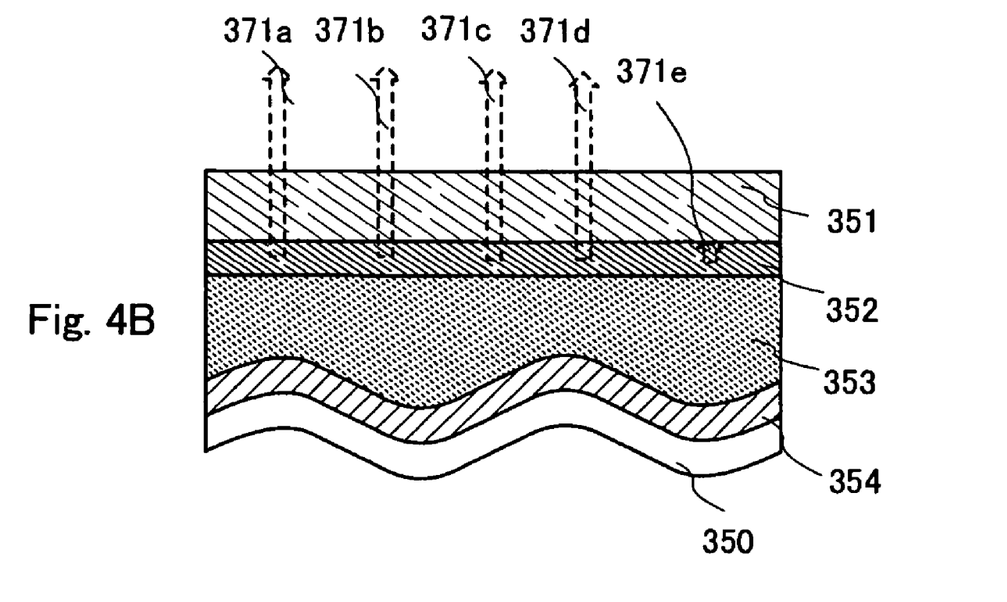

FIG. 4(B) shows an example of a laser element in which a substrate 350 which forms the laser element is formed to have a concave and convex shape. In FIG. 4(B), the substrate 350 has a curved shape so as to have concave and convex shapes on both sides; however, only one of the surfaces in which an element is formed has a concave and convex shape, and the other surface may be a flat surface.

A first electrode 354 formed on the substrate 350 having a concave and convex shape is formed by reflecting a concave and convex shape of the substrate 350. A mixed layer 353 of an organic compound and a metal oxide is formed so as to planarize a concave and convex surface of the first electrode on the first electrode 354. A layer 352 having an organic compound with a light-emitting property and a second electrode 351 are sequentially formed over the mixed layer 353 of an organic compound and a metal oxide, and a laser element including a laminated body containing an organic compound with a light-emitting property which has a thickness distribution as shown in FIG. 4(B) is manufactured.

In this embodiment mode, light emitted from the layer 352 having an organic compound with a light-emitting property is repeatedly amplified to be emitted from the second electrode 351 side as laser light 371a, laser light 371b, laser light 371d, and laser light 371d eventually. The mixed layer 353 of an organic compound and a metal oxide has a difference in its thickness depending on regions; therefore, a laminated body containing an organic compound with a light-emitting property which exists between electrodes has a thickness distribution. A wavelength of emitted laser light is greatly affected by its thickness. Accordingly, each laser light 371a, laser light 371b, laser light 371d, and laser light 371d has a different wavelength, and there is a case where laser light is attenuated without being emitted to the outside of a laser element as laser light, like light 371e.

Embodiment Mode 4

In this embodiment mode, an example in which a precise laser processing is performed by a laser element manufactured using the present invention will be described with reference to FIG. 3. A laser element used for a processing can be formed concurrently with the laser element which is manufactured with any of Embodiment Modes 1 to 3. Accordingly, the descriptions of the same portions or the portions having similar functions are omitted.

Figure 3A:
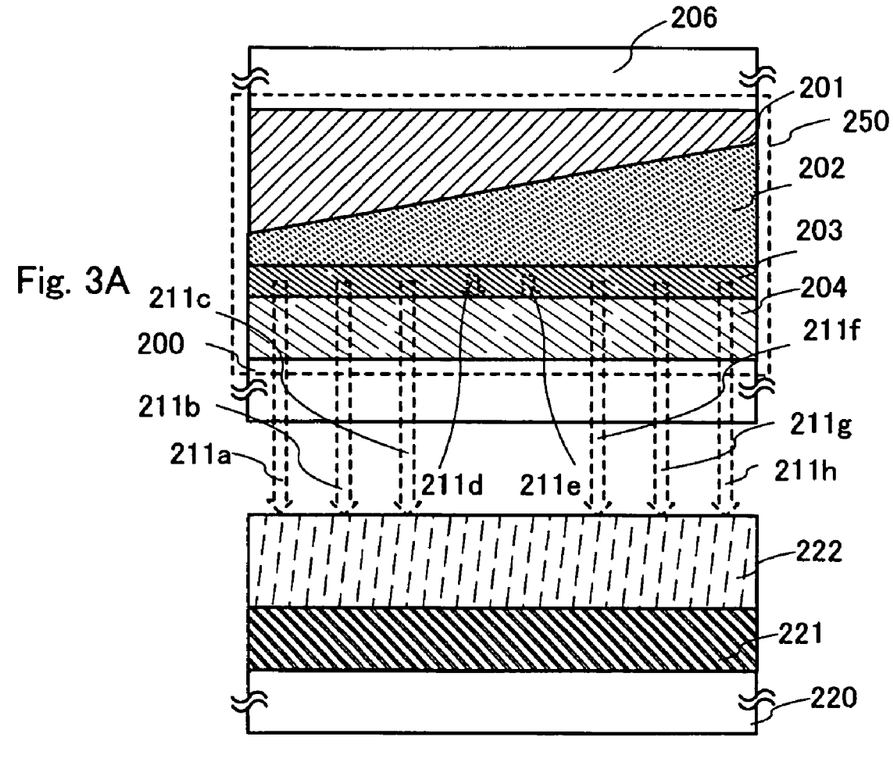
Figure 3B:
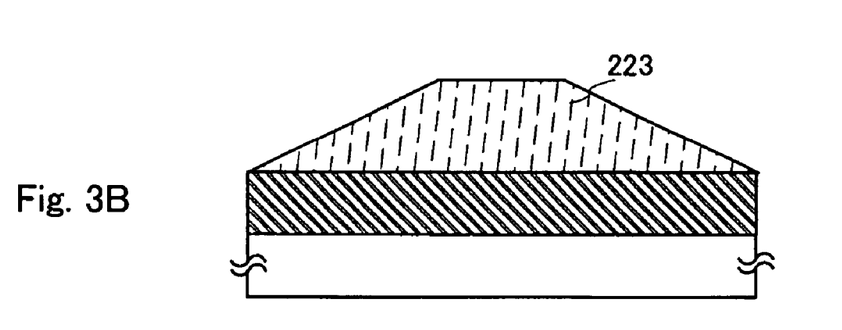
Figure 3C:
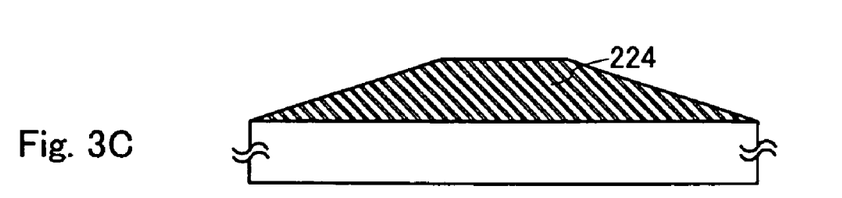

In this embodiment mode, the laser element of the present invention is used for exposure of a mask used for a process of a conductive film. A conductive film 221 is formed on a substrate 220. A photosensitive resist film 222 which becomes a mask is formed on the conductive film 221. In this embodiment mode, exposure treatment of the photosensitive resist film 222 is performed by laser light emitted from a laser element 250 shown in this embodiment mode. If an insulating film is formed on the substrate also in a case where the insulating film is processed into a desired shape, a process can be performed in the same manner as the case of the conductive film.

The laser element 250 is supported so as to be sandwiched between a substrate 200 and a cover material 206. It is necessary that the substrate 200 should have a transmisstting property to emitted laser light 211a, laser light 211b, laser light 211c, laser light 211f, laser light 211g, and laser light 211h; however, the cover material 206 may have a function of a protective film which protects the laser element 250. Since the cover material 206 is a protective film which shields a contamination source such as water, a material having a precise structure is preferable.

The laser element 250 is constituted of a first electrode 204 on a first substrate 200, a layer 203 containing an organic compound with a light-emitting property, a mixed layer 202 of an organic compound and a metal oxide, and a second electrode 201. The mixed layer 202 of an organic compound and a metal oxide has a shape in which a thickness is continuously changed, and has a difference in a thickness in the layer. Accordingly, a laminated body containing an organic compound with a light-emitting property which is formed from the layer 203 containing an organic compound with a light-emitting property and the mixed layer 202 of an organic compound and a metal oxide having a thickness distribution in the laminated body, which determines a wavelength of emitted laser light, also has a thickness distribution. The second electrode 201 is formed on the mixed layer 202 of an organic compound and a metal oxide so as to planarize the difference in a thickness which was generated by the shape of the mixed layer 202 of an organic compound and a metal oxide, and a cover material 206 is formed.

In this embodiment mode, light emitted from the layer 203 having an organic compound with a light-emitting property is repeatedly amplified to be emitted from the first electrode 204 side and emitted to the resist film 222 as laser light 211a, laser light 211b, laser light 211c, laser light 211f, laser light 211g, and laser light 211h eventually (FIG. 3(A)). The mixed layer 202 of an organic compound and a metal oxide has a difference in its thickness; therefore, a laminated body containing an organic compound with a light-emitting property which exists between electrodes has a thickness distribution. A wavelength of emitted laser light is greatly affected by its thickness. Accordingly, each laser light 211a, laser light 211b, laser light 211c, laser light 211f, laser light 211g, and laser light 211h has a different wavelength and intensity, and a region in which laser light is attenuated without being emitted to the outside of a laser element as laser light, like light 211d and light 211e, can be created.

By changing the thickness of the mixed layer 202 of a metal oxide and an organic compound and dimensions of regions in which the thicknesses are different, a spectrum shape obtained from one element can be controlled. In other words, in an emission spectrum obtained from one element, a wavelength of light emission and its intensity can be arbitrarily controlled. Accordingly, exposure of the resist film 222 can be precisely performed into a desired pattern, with good controllability, and a mask 223 to which a precise process was performed can be formed (FIG. 3(B).) A precise process is performed to the mixed layer 202 of a metal oxide and an organic compound, and if the shape is set to be a desired shape, laser light of each wavelength and intensity is emitted by a difference in a thickness provided in the mixed layer 202 of a metal oxide and an organic compound. By emitting these laser light, the shape of the mixed layer 202 of a metal oxide and an organic compound is reflected, and a mask layer, a conductive layer, an insulating layer, or the like can be processed into a desired shape. Accordingly, a processed substance such as a conductive layer or an insulating layer can be obtained in a precise and accurate shape. In this embodiment mode, a conductive layer 224 with a desired shape which is precisely processed is formed by using the mask 223 processed into a desired shape (FIG. 3(C)).

In a conventional laser processing, processing is performed by moving a laser device itself. On the other hand, in this embodiment mode, a processing region can be set only by reducing or enlarging a figure displayed by laser oscillation. Also, laser light having different intensity or wavelength can be emitted as a plane; therefore, ultrafine processing in high definition can be performed quickly, and productivity is increased.

Embodiment Mode 5

An application example to which the present invention can be applied will be described with reference to FIG. 5.

Figure 5A:
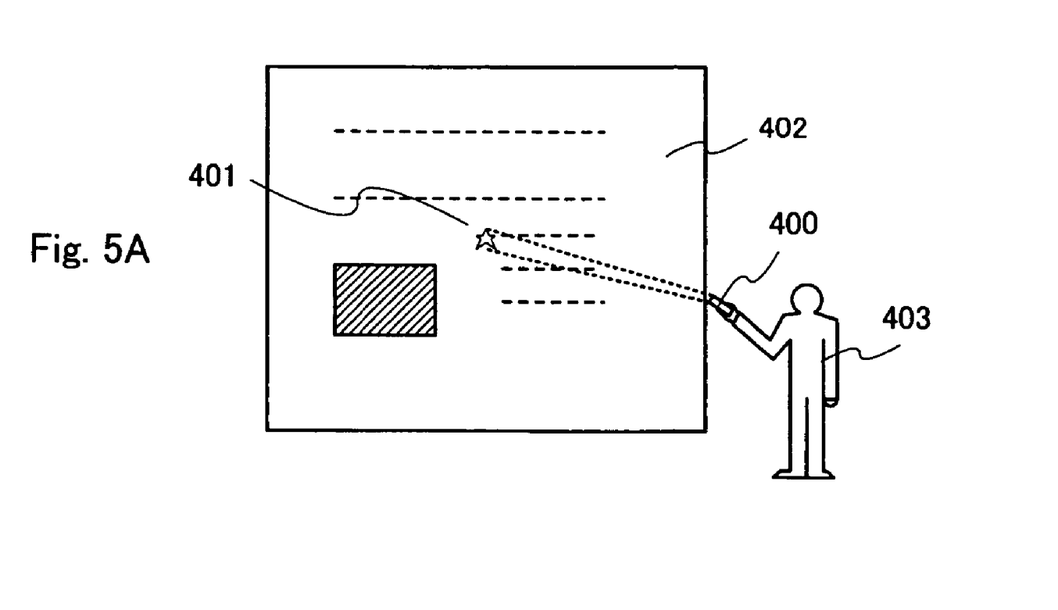

An example, in which the laser element of the present invention is applied to a laser pointer used at a lecture or a meeting, is shown in FIG. 5(A). In FIG. 5(A), a user 403 uses an image 401 emitted from a laser pointer 400, in order to explain what is displayed in a screen 402. Since the laser element of the present invention is used for the laser pointer 400, the image 401 can display a complex design with multicolor light.

Since a wide variety of images can be displayed, a presentation with high stage effect can be performed. In addition, when a laser pointer which can display an image peculiar to each individual is used at a meeting or the like where multiple people use one screen, an ability to identify individual can be provided to the image; therefore, confusion can be avoided and the meeting can be proceeded smoothly. Of course, it is also possible to enlarge an image which is displayed and use the image as a small display device. A wide variety of images can be displayed by using the laser element of the present invention.

Figure 5B:
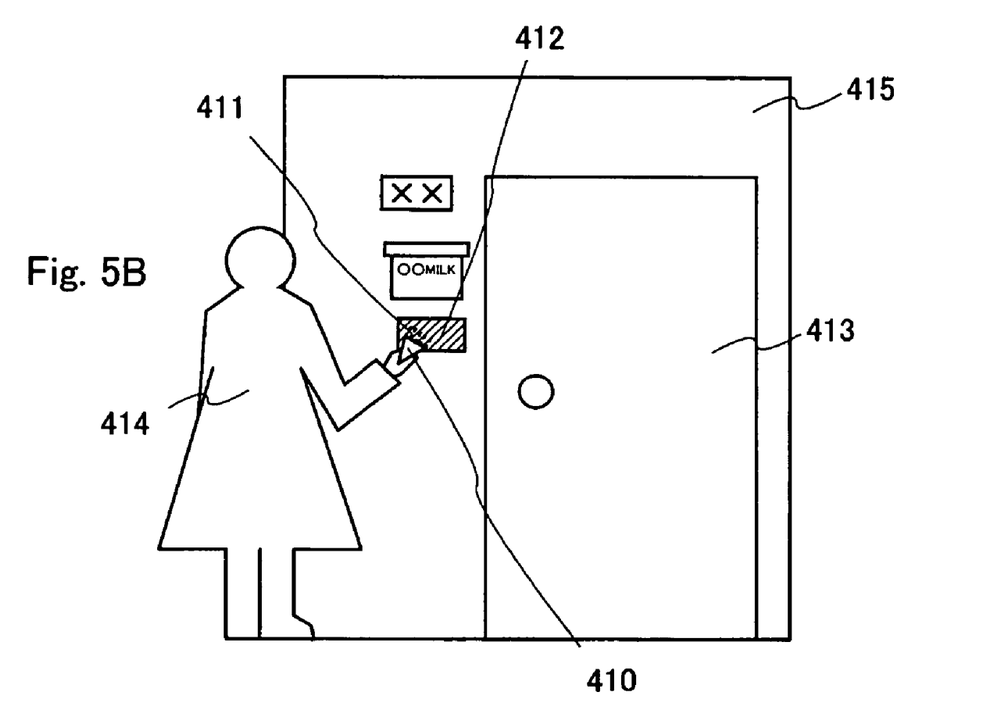

Next, the laser element of the present invention can be used as a key (sensor) with high security performance. In FIG. 5(B), an example in which the laser element of the present invention is used as a key for a building such as housing is shown. The laser element of the present invention reflects a thickness distribution of a laminated body containing an organic compound with a light-emitting property and an area ratio of regions having different thicknesses, and a spectrum shape obtained from one element is minutely changed. Therefore, when processing which is performed to an electrode which determines a thickness distribution of a laminated body containing an organic compound with a light-emitting property and a state of the distribution, and a mixed layer of a metal oxide and an organic compound is set to be a complicated process which is impossible to recreate or a sort of an accidental process which needs a lot of conditions, changes in an oscillation wavelength and an oscillation place are also generated with laser light emitted from a laser element. Therefore, the laser light can be used as a convenient key for individual identification. In FIG. 5(B), a door 413 provided for a building 415 is locked with a key 410 having a laser element. A sensor 412 is irradiated with laser light 411 having a specific spectrum shape emitted from the key 410 having a laser element so that the door 413 is unlocked by a user 414. As described above, the laser element which emits laser light having a specific spectrum shape can be used as a small and convenient key with high security performance.

BRIEF DESCRIPTION OF THE DRAWINGS

[FIG. 1] A drawing explaining a laser element which uses the present invention.

[FIG. 2] A drawing explaining a laser element which uses the present invention.

[FIG. 3] A drawing explaining a laser element which uses the present invention.

[FIG. 4] A drawing explaining an example of using a laser element which uses the present invention.

[FIG. 5] A drawing explaining an application example in which a laser element which uses the present invention is applied.

The invention claimed is:
1. A laser element comprising:
a laminated body between two electrodes,
wherein the laminated body includes a layer containing an organic compound with a light-emitting property,
wherein the laminated body includes a mixed layer containing a metal oxide and an organic compound,
wherein the mixed layer has different thicknesses in at least two places of the mixed layer, and
wherein the layer containing the organic compound is in contact with the mixed layer containing the metal oxide and the organic compound.
2. A laser element according to claim 1, wherein one of the electrodes has different thicknesses in at least two places of the electrode.
3. A laser element comprising:
a laminated body between two electrodes,
wherein the laminated body includes a layer containing an organic compound with a light-emitting property,
wherein the laminated body includes a mixed layer containing a metal oxide and an organic compound,
wherein the mixed layer has different thicknesses in at least two places of the mixed layer,
wherein one of the electrodes is provided over an insulating layer, and
wherein the layer containing the organic compound is in contact with the mixed layer containing the metal oxide and the organic compound.
4. A laser element according to claim 3, wherein one of the electrodes has different thicknesses in at least two places of the electrode.
5. A laser element according to claim 3, wherein the insulating layer has different thicknesses in at least two places of the insulating layer.
6. A laser element comprising:
a laminated body between two electrodes,
wherein the laminated body includes a layer containing an organic compound with a light-emitting property,
wherein the laminated body includes a mixed layer containing a metal oxide and an organic compound,
wherein the mixed layer has different thicknesses in at least two places of the mixed layer,
wherein the mixed layer has an oscillation of light having different wavelengths in regions having different thicknesses, and
wherein the layer containing the organic compound is in contact with the mixed layer containing the metal oxide and the organic compound.
7. A laser element according to claim 6, wherein one of the electrodes has different thicknesses in at least two places of the electrode.
8. A laser element comprising:
a first electrode having different thicknesses in at least two places of the first electrode;
a first layer containing a metal oxide and an organic compound, which is formed over the first electrode;
a second layer containing an organic compound with a light-emitting property, which is formed on and in contact with the first layer; and
a second electrode formed over the second layer,
wherein the first layer has different thicknesses in at least two places of the first layer.
9. A laser element comprising:
a first electrode having different thicknesses in at least two places of the first electrode;
a first layer containing a first metal oxide and a first organic compound, which is formed over the first electrode;
a second layer containing an organic compound with a light-emitting property, which is formed over the first layer;
a third layer containing a second metal oxide and a second organic compound, which is formed over the second layer; and
a second electrode formed over the third layer,
wherein the first layer has different thicknesses in at least two places of the first layer.
10. A laser element comprising:
a first electrode;
a first layer containing an organic compound with a light-emitting property, which is formed over the first electrode;
a second layer formed on and in contact with the first layer, which has different thicknesses in at least two places of the second layer and contains a metal oxide and an organic compound; and
a second electrode formed over the second layer.
11. A laser element comprising:
a first electrode;
a first layer containing a first metal oxide and a first organic compound, which is formed over the first electrode;
a second layer containing an organic compound with a light-emitting property, which is formed over the first layer;
a third layer formed over the second layer, which has different thicknesses in at least two places of the third layer and contains a second metal oxide and a second organic compound; and
a second electrode formed over the third layer.

12. A laser element comprising:
an insulating layer having a concave and convex shape;
a first electrode formed over the insulating layer;
a first layer containing a metal oxide and an organic compound, which is formed over the first electrode;
a second layer containing an organic compound with a light-emitting property, which is formed on and in contact with the first layer; and
a second electrode formed over the second layer,
wherein the first layer has different thicknesses in at least two places of the first layer.

13. A laser element according to claim 1, wherein the metal oxide is a transition metal oxide showing an electron accepting property or hole transporting property to the organic compound.

14. A laser element according to claim 13, wherein the metal oxide is selected from a group consisting of titanium oxide, zirconium oxide, hafnium oxide, vanadium oxide, niobium oxide, tantalum oxide, chromium oxide, molybdenum oxide, tungsten oxide, rhenium oxide, and ruthenium oxide.

15. A laser element according to claim 1, wherein the metal oxide is a material showing an electron donating property.

16. A laser element according to claim 15, wherein the metal oxide is selected from a group consisting of lithium oxide, strontium oxide, barium oxide and erbium oxide.

17. A laser element according to claim 3, wherein the metal oxide is a transition metal oxide showing an electron accepting property or hole transporting property to the organic compound.

18. A laser element according to claim 17, wherein the metal oxide is selected from a group consisting of titanium oxide, zirconium oxide, hafnium oxide, vanadium oxide, niobium oxide, tantalum oxide, chromium oxide, molybdenum oxide, tungsten oxide, rhenium oxide, and ruthenium oxide.

19. A laser element according to claim 3, wherein the metal oxide is a material showing an electron donating property.

20. A laser element according to claim 19, wherein the metal oxide is selected from a group consisting of lithium oxide, strontium oxide, barium oxide and erbium oxide.

21. A laser element according to claim 6, wherein the metal oxide is a transition metal oxide showing an electron accepting property or hole transporting property to the organic compound.

22. A laser element according to claim 21, wherein the metal oxide is selected from a group consisting of titanium oxide, zirconium oxide, hafnium oxide, vanadium oxide, niobium oxide, tantalum oxide, chromium oxide, molybdenum oxide, tungsten oxide, rhenium oxide, and ruthenium oxide.

23. A laser element according to claim 6, wherein the metal oxide is a material showing an electron donating property.

24. A laser element according to claim 23, wherein the metal oxide is selected from a group consisting of lithium oxide, strontium oxide, barium oxide and erbium oxide.

25. A laser element according to claim 8, wherein the metal oxide is a transition metal oxide showing an electron accepting property or hole transporting property to the organic compound.

26. A laser element according to claim 25, wherein the metal oxide is selected from a group consisting of titanium oxide, zirconium oxide, hafnium oxide, vanadium oxide, niobium oxide, tantalum oxide, chromium oxide, molybdenum oxide, tungsten oxide, rhenium oxide, and ruthenium oxide.

27. A laser element according to claim 8, wherein the metal oxide is a material showing an electron donating property.

28. A laser element according to claim 27, wherein the metal oxide is selected from a group consisting of lithium oxide, strontium oxide, barium oxide and erbium oxide.

29. A laser element according to claim 9, wherein the first metal oxide or the second metal oxide is a transition metal oxide showing an electron accepting property or hole transporting property to the organic compound.

30. A laser element according to claim 29, wherein the first metal oxide or the second metal oxide is selected from a group consisting of titanium oxide, zirconium oxide, hafnium oxide, vanadium oxide, niobium oxide, tantalum oxide, chromium oxide, molybdenum oxide, tungsten oxide, rhenium oxide, and ruthenium oxide.

31. A laser element according to claim 9, wherein the first metal oxide or the second metal oxide is a material showing an electron donating property.

32. A laser element according to claim 31, wherein the first metal oxide or the second metal oxide is selected from a group consisting of lithium oxide, strontium oxide, barium oxide and erbium oxide.

33. A laser element according to claim 10, wherein the metal oxide is a transition metal oxide showing an electron accepting property or hole transporting property to the organic compound.

34. A laser element according to claim 33, wherein the metal oxide is selected from a group consisting of titanium oxide, zirconium oxide, hafnium oxide, vanadium oxide, niobium oxide, tantalum oxide, chromium oxide, molybdenum oxide, tungsten oxide, rhenium oxide, and ruthenium oxide.

35. A laser element according to claim 10, wherein the metal oxide is a material showing an electron donating property.

36. A laser element according to claim 35, wherein the metal oxide is selected from a group consisting of lithium oxide, strontium oxide, barium oxide and erbium oxide.

37. A laser element according to claim 11, wherein the first metal oxide or the second metal oxide is a transition metal oxide showing an electron accepting property or hole transporting property to the organic compound.

38. A laser element according to claim 37, wherein the first metal oxide or the second metal oxide is selected from a group consisting of titanium oxide, zirconium oxide, hafnium oxide, vanadium oxide, niobium oxide, tantalum oxide, chromium oxide, molybdenum oxide, tungsten oxide, rhenium oxide, and ruthenium oxide.

39. A laser element according to claim 11, wherein the first metal oxide or the second metal oxide is a material showing an electron donating property.

40. A laser element according to claim 39, wherein the first metal oxide or the second metal oxide is selected from a group consisting of lithium oxide, strontium oxide, barium oxide and erbium oxide.

41. A laser element according to claim 12, wherein the metal oxide is a transition metal oxide showing an electron accepting property or hole transporting property to the organic compound.

42. A laser element according to claim 41, wherein the metal oxide is selected from a group consisting of titanium oxide, zirconium oxide, hafnium oxide, vanadium oxide, niobium oxide, tantalum oxide, chromium oxide, molybdenum oxide, tungsten oxide, rhenium oxide, and ruthenium oxide.

43. A laser element according to claim 12, wherein the metal oxide is a material showing an electron donating property.

44. A laser element according to claim 43, wherein the metal oxide is selected from a group consisting of lithium oxide, strontium oxide, barium oxide and erbium oxide.

* * * * *